(12) United States Patent
Osanai et al.

(10) Patent No.: US 12,300,512 B2
(45) Date of Patent: May 13, 2025

(54) METAL/CERAMIC BONDING SUBSTRATE AND METHOD FOR PRODUCING SAME

(71) Applicant: DOWA METALTECH CO., LTD., Tokyo (JP)

(72) Inventors: Hideyo Osanai, Tokyo (JP); Akira Sugawara, Tokyo (JP)

(73) Assignee: DOWA METALTECH CO., LTD., Tokyo (JP)

( * ) Notice: Subject to any disclaimer, the term of this patent is extended or adjusted under 35 U.S.C. 154(b) by 583 days.

(21) Appl. No.: 17/623,293

(22) PCT Filed: Jun. 11, 2020

(86) PCT No.: PCT/JP2020/022998
§ 371 (c)(1),
(2) Date: Dec. 28, 2021

(87) PCT Pub. No.: WO2020/262015
PCT Pub. Date: Dec. 30, 2020

(65) Prior Publication Data
US 2022/0367316 A1 Nov. 17, 2022

(30) Foreign Application Priority Data
Jun. 28, 2019 (JP) .................................. 2019-122001
May 28, 2020 (JP) .................................. 2020-092939

(51) Int. Cl.
*H01L 21/48* (2006.01)
*H01L 23/373* (2006.01)
*H05K 1/02* (2006.01)

(52) U.S. Cl.
CPC ...... *H01L 21/4871* (2013.01); *H01L 21/4807* (2013.01); *H01L 23/3735* (2013.01); *H05K 1/0203* (2013.01)

(58) Field of Classification Search
CPC ............. H01L 21/4871; H01L 21/4807; H01L 23/3735; H05K 1/0203
See application file for complete search history.

(56) References Cited

U.S. PATENT DOCUMENTS

| 2012/0298408 A1 | 11/2012 | Nagatomo et al. |
| 2016/0209133 A1* | 7/2016 | Hu ....................... H01L 21/4882 |
| 2018/0035529 A1* | 2/2018 | Arai ........................ F28F 21/02 |

FOREIGN PATENT DOCUMENTS

| JP | 2007036263 A | 2/2007 |
| JP | 2008199057 A | 8/2008 |

(Continued)

OTHER PUBLICATIONS

Extended European Search Report Dated Jun. 9, 2023 for corresponding application No. 20832352.7.

(Continued)

*Primary Examiner* — Michelle Mandala
*Assistant Examiner* — Jordan M Klein
(74) *Attorney, Agent, or Firm* — Bachman & LaPointe, P.C.

(57) ABSTRACT

There is provided an inexpensive metal/ceramic bonding substrate which has a metal circuit plate of aluminum or an aluminum alloy bonded directly to a ceramic substrate and which can prevent a large difference in level from being caused on portions corresponding to the grain boundaries of aluminum or the aluminum alloy even if heat cycles are repeatedly applied to the metal/ceramic bonding substrate, and a method for producing the same. In the preferred embodiment of a metal/ceramic bonding substrate, one side of a ceramic substrate 12 is bonded directly to a metal base plate 10 of aluminum or an aluminum alloy, and the other side of the ceramic substrate 12 is bonded directly to one side of a first metal plate 14 (for circuit pattern) of aluminum or the aluminum alloy, the other side of first metal plate 14

(Continued)

being bonded directly to one side of a graphite sheet 16, and the other side of the graphite sheet 16 being bonded directly to a second metal plate (for circuit pattern) 18 of aluminum or the aluminum alloy.

6 Claims, 2 Drawing Sheets

(56) References Cited

FOREIGN PATENT DOCUMENTS

| JP | 2015076445 A | | 4/2015 | | |
|----|--------------|---|--------|---|---|
| JP | 2016015324 A | | 1/2016 | | |
| JP | 2017212316 A | | 11/2017 | | |
| JP | 2018018992 | * | 2/2018 | ............ | H01L 23/12 |
| JP | 2018018992 A | | 2/2018 | | |
| JP | 2018135251 A | | 8/2018 | | |
| JP | 2019029510 A | | 2/2019 | | |

OTHER PUBLICATIONS

International search report for patent application No. PCT/JP2020/022998 dated Dec. 8, 2020.

* cited by examiner

METAL/CERAMIC BONDING SUBSTRATE AND METHOD FOR PRODUCING SAME

BACKGROUND OF THE INVENTION

The present invention generally relates to a metal/ceramic bonding substrate and a method for producing the same. More specifically, the invention relates to a metal/ceramic bonding substrate wherein a metal plate (a metal circuit plate) for mounting electronic parts thereon is formed on one side of a ceramic substrate and wherein a metal base plate for heat radiation is formed on the other side thereof, and a method for producing the same.

In recent years, as a metal/ceramic insulating substrate for a power module, there is used a metal/ceramic circuit board wherein a metal circuit plate of aluminum or an aluminum alloy is bonded directly to a ceramic substrate in order to realize a higher heat cycle resistance.

However, if heat cycles are repeatedly applied to such a metal/ceramic circuit board, a stress is caused by the difference in coefficient of linear expansion between the ceramic substrate having a small coefficient of linear expansion and the metal circuit plate of aluminum or the aluminum alloy having a large coefficient of linear expansion since the metal circuit plate is bonded directly to the ceramic substrate. This stress causes the plastic deformation of aluminum or the aluminum alloy to cause deformation (a difference in level), such as large winkles, on portions corresponding to the grain boundaries of aluminum or the aluminum alloy. For that reason, there is some possibility that semiconductor devices soldered on the metal circuit plate may be damaged, that cracks may be produced in the solder, and/or that the bonding wire connecting the semiconductor devices to the metal circuit plate may be peeled off.

In order to solve such problems, there are proposed a semiconductor packing insulating substrate wherein a metal alloy layer (mainly containing aluminum) having a Vickers hardness HV of not less than 25 is formed on a ceramic substrate (see, e.g., Patent Document 1), a metal/ceramic circuit board wherein a metal film of copper, a copper alloy or the like is formed, by a cold spraying method, on a metal circuit plate of aluminum or an aluminum alloy which is formed on a ceramic substrate (see, e.g., Patent Document 2), a metal/ceramic circuit board wherein a nickel-plating film having a thickness of not less than 17 µm is formed on the surface of a metal circuit plate of aluminum bonded directly to a ceramic substrate (see, e.g., Patent Document 3) and so forth.

PRIOR ART DOCUMENT(S)

Patent Document(s)

Patent Document 1: JP2007-36263A (Paragraph Number 0014)
Patent Document 2: JP2016-152324A (Paragraph Numbers 0009-0011)
Patent Document 3: JP2018-18992A (Paragraph Numbers 0009-0010)

SUMMARY OF THE INVENTION

However, if a hard metal alloy layer (mainly containing aluminum) is formed on a ceramic substrate as the semiconductor packing insulating substrate of Patent Document 1, there is some possibility that cracks may be produced in the ceramic substrate without causing the plastic deformation of aluminum during heat cycles. In addition, hard aluminum usually has a low purity, and the thermal conductivity and electrical conductivity thereof are deteriorated, so that the characteristics as the semiconductor packing insulating substrate are deteriorated.

In the metal/ceramic circuit board of Patent Document 2, the hard metal film formed by the cold spraying method is porous, and the surface thereof is rough. For that reason, it is required to cause the surface of the metal film to be smooth by blasting or the like, so that the producing costs thereof are increased.

In the metal/ceramic circuit board of Patent Document 3, it is required to form the hard nickel-plating film having the very large thickness on the surface of the metal circuit plate of aluminum. For that reason, the plating time is increased, so that the producing costs thereof are increased.

It is therefore an object of the present invention to eliminate the aforementioned conventional problems and to provide an inexpensive metal/ceramic bonding substrate which has a metal circuit plate of aluminum or an aluminum alloy bonded directly to a ceramic substrate and which can prevent a large difference in level from being caused on portions corresponding to the grain boundaries of aluminum or the aluminum alloy even if heat cycles are repeatedly applied to the metal/ceramic bonding substrate, and a method for producing the same.

In order to accomplish the aforementioned object, the inventors have diligently studied and found that it is possible to produce an inexpensive metal/ceramic bonding substrate which can prevent a large difference in level from being caused on portions corresponding to the grain boundaries of aluminum or an aluminum alloy even if heat cycles are repeatedly applied to the metal/ceramic bonding substrate, if one side of a ceramic substrate is bonded directly to a metal base plate of aluminum or an aluminum alloy, one side of a first metal plate of aluminum or the aluminum alloy being bonded directly to the other side of the ceramic substrate, one side of a graphite sheet being bonded directly to the other side of the first metal plate, and a second metal plate of aluminum or the aluminum alloy being bonded directly to the other side of the graphite sheet. Thus, the inventors have made the present invention.

According to the present invention, there is provided a metal/ceramic bonding substrate comprising: a metal base plate of aluminum or an aluminum alloy; a ceramic substrate, one side of which is bonded directly to the metal base plate; a first metal plate of aluminum or the aluminum alloy, one side of which is bonded directly to the other side of the ceramic substrate; a graphite sheet, one side of which is bonded directly to the other side of the first metal plate; and a second metal plate of aluminum or the aluminum alloy which is bonded directly to the other side of the graphite sheet.

In this metal/ceramic bonding substrate, the graphite sheet preferably extends in substantially parallel to a bonding surface of the first metal plate to the ceramic substrate, and preferably extends on a substantially entire surface of a plane which extends in substantially parallel to the bonding surface of the first metal plate to the ceramic substrate. The graphite sheet preferably has an end face which is exposed to the outside. In addition, a circuit pattern is preferably formed by the first metal plate, the graphite sheet and the second metal plate.

According to the present invention, there is provided a method for producing a metal/ceramic bonding substrate, the method comprising the steps of: causing a peripheral portion of a graphite sheet and a peripheral portion of a ceramic substrate to be supported on a mold so that the graphite sheet and the ceramic substrate are arranged in substantially parallel to each other in the mold so as to be apart from each other; injecting a molten metal of aluminum or an aluminum alloy into the mold so as to allow the molten metal to contact both sides of the graphite sheet and both sides of the ceramic substrate in the mold; and cooling and solidifying the molten metal in the mold to form a metal base plate of aluminum or the aluminum alloy to bond the metal base plate directly to one side of the ceramic substrate, while forming a first metal plate of aluminum or the aluminum alloy to bond the first metal plate directly to one side of the graphite sheet and to the other side of the ceramic substrate, and while forming a second metal plate of aluminum or the aluminum alloy to bond the second metal plate directly to the other side of the graphite sheet.

In this method for producing a metal/ceramic bonding substrate, the method further comprises: forming a mask on the surface of the second metal plate of the metal/ceramic bonding substrate; removing a portion other than a portion, which corresponds to a shape of a circuit pattern of the mask, second metal plate, graphite sheet and first metal plate, in thickness directions thereof from the surface of the mask by milling to cause the mask, the second metal plate, the graphite sheet and the first metal plate to have the shape of the circuit pattern, except that a portion of the first metal plate on the side of the ceramic substrate is caused to remain; etching the portion of the first metal plate other than the portion, which corresponds to the shape of the circuit pattern, on the surface of the ceramic substrate; and removing the mask to form the circuit pattern of the first metal plate, graphite sheet and second metal plate.

According to the present invention, it is possible to produce an inexpensive metal/ceramic bonding substrate which has a metal circuit plate of aluminum or an aluminum alloy bonded directly to a ceramic substrate and which can prevent a large difference in level from being caused on portions corresponding to the grain boundaries of aluminum or the aluminum alloy even if heat cycles are repeatedly applied to the metal/ceramic bonding substrate.

DETAILED DESCRIPTION

Referring to the accompanying drawings, the preferred embodiment of a metal/ceramic bonding substrate and a method for producing the same according to the present invention will be described below in detail.

Figure 1:
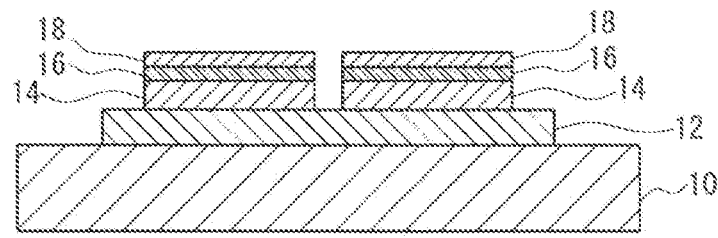
FIG. 1 is a sectional view of the preferred embodiment of a metal/ceramic bonding substrate according to the present invention.

As shown in FIG. 1, the preferred embodiment of a metal/ceramic bonding substrate according to the present invention, comprises: a metal base plate 10 of aluminum or an aluminum alloy having a substantially rectangular planar shape; a ceramic substrate 12 having a substantially rectangular planar shape, one side of the ceramic substrate being bonded directly to the metal base plate 10 (chemically bonded to the metal base plate 10 at a sufficient bonding strength); a first metal plate (for circuit pattern) 14 of aluminum or the aluminum alloy having a substantially rectangular planar shape, one side of the first metal plate 14 being bonded directly to the other side of the ceramic substrate 12 (chemically bonded to the other side of the ceramic substrate 12 at a sufficient bonding strength); a graphite sheet 16 having a substantially rectangular planar shape (substantially having the same size as that of the first metal plate 14), one side of the graphite sheet 16 being bonded directly to the other side of the first metal plate 14 (chemically bonded to the other side of the first metal plate 14 at a sufficient bonding strength); and a second metal plate (for circuit pattern) 18 of aluminum or the aluminum alloy having a substantially rectangular planar shape (substantially having the same size as that of the graphite sheet 16), the second metal plate 18 being bonded directly to the other side of the graphite sheet 16 (chemically bonded to the other side of the graphite sheet 16 at a sufficient bonding strength). The graphite sheet 16 extends in substantially parallel to the bonding surface of the first metal plate 14 to the ceramic substrate 12 and extends on the substantially entire surface of a plane (an imaginary plane) which extends in substantially parallel to the bonding surface of the first metal plate 14 to the ceramic substrate 12. The peripheral portion (preferably over the entire circumference) of the graphite sheet 16 is exposed to the outside.

The graphite sheet 16 may be a sheet (plate material) of graphite having a thickness of 10 to 1000 μm (preferably 30 to 120 μm), a thermal conductivity of 250 to 2000 W/m·K (preferably 900 to 2000 W/m·K) in horizontal directions, a thermal conductivity of 10 to 30 W/m·K (preferably 18 to 30 W/m·K) in thickness directions and a linear expansion coefficient of 2 to 10 ppm/K (preferably 4 to 7 ppm/K). If such a graphite sheet 16 is arranged between the first metal plate (for circuit pattern) 14 and the second metal plate (for circuit pattern) 18, it is possible to produce a metal/ceramic bonding substrate which can suppress the distortion (deformation) of the surface of the second metal plate (for circuit pattern) 18 and which can inhibit winkles from being caused on the surface of the second metal plate (for circuit pattern) 18 after heat cycles, the metal/ceramic bonding substrate being capable of preventing heat cycles from producing cracks in the ceramic substrate 12 and semiconductor devices or the like (mounted on the second metal plate 18) to decrease the producing costs thereof, the metal/ceramic bonding substrate having excellent thermal conductivity and excellent electrical conductivity. In addition, if the second metal plate 18 is arranged on the outermost surface, it is possible to carry out the plating of the surface, the ultrasonic bonding using an aluminum wire, a copper wire or the like, and the ultrasonic bonding of a copper terminal.

Figure 2:
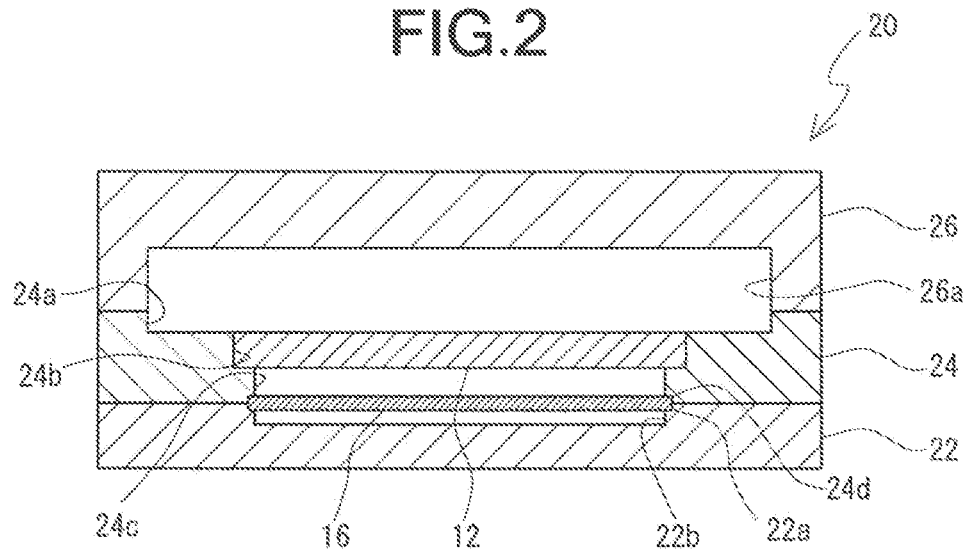
FIG. 2 is a sectional view of a mold used for producing the metal/ceramic bonding substrate of FIG. 1.

The metal/ceramic bonding substrate in the preferred embodiment shown in FIG. 1 can be produced by a method comprising the steps of: causing the peripheral portion of a ceramic substrate 12 and the peripheral portion of a graphite sheet 16 to be supported on a mold 20 shown in FIG. 2 so that the ceramic substrate 12 and the graphite sheet 16 are arranged so as to be spaced apart from each other in the mold 20; heating the interior of the mold 20 in a state that the atmosphere therein is an atmosphere of nitrogen; injecting a molten metal of aluminum or an aluminum alloy into the mold 20 so as to allow the molten metal to contact both sides of the ceramic substrate 12 and both sides of the graphite sheet 16 in the mold 20 while removing oxide films on the surface of the molten metal; and thereafter, cooling the mold 20 to solidify the molten metal.

The mold 20 is made of carbon or the like. As shown in FIG. 2, the mold 20 comprises a lower mold member 22, an intermediate mold member 24 and an upper mold member 26, each of which has a substantially rectangular planar shape.

As shown in FIG. 2, the top surface of the lower mold member 22 has a recessed portion (a graphite sheet housing portion) 22a for housing therein a portion (nearly half in this preferred embodiment) of the graphite sheet 16 on the side of the second metal plate 18, the recessed portion 22a substantially having the same shape and size as those of the portion of the graphite sheet 16 on the side of the second metal plate 18. The bottom surface of the recessed portion 22a has a recessed portion (a second metal plate forming portion) 22b for forming the second metal plate 18.

The top surface of the intermediate mold member 24 has a recessed portion (a metal base plate forming portion) 24a for forming a portion of the metal base plate 10 on the side of the ceramic substrate 12. The bottom surface of the recessed portion 24a has a recessed portion (a ceramic substrate housing portion) 24b for housing therein the ceramic substrate 12, the recessed portion 24b substantially having the same shape and size as those of the ceramic substrate 12. The bottom surface of the recessed portion 24b has a through hole (a first metal forming portion) 24c for forming the first metal plate 14, the through hole 24c substantially having the same shape and size as those of the first metal plate 14. The bottom surface (back surface) of the intermediate mold member 24 has a recessed portion (a graphite sheet housing portion) 24d for housing therein a portion (nearly half in this preferred embodiment) of the graphite sheet 16 on the side of the first metal plate 14, the recessed portion 24d substantially having the same shape and size as those of the portion of the graphite sheet 16 on the side of the first metal plate 14. The graphite sheet housing portion 24d has an opening in a portion other than the peripheral portion of the bottom surface thereof, the opening of the graphite sheet housing portion 24d being communicated with the first metal plate forming portion 24c. The graphite sheet 16 is designed to be housed in a space defined by the graphite sheet housing portion 24d and the graphite sheet housing portion 22a of the lower mold member 22, and the peripheral portion of the graphite sheet 16 is designed to be clamped to be fixed by the graphite sheet housing portion 22a of the lower mold member 22 and the graphite sheet housing portion 24d of the intermediate mold member 24.

The lower surface (back surface) of the upper mold member 26 has a recessed portion (a metal base forming portion) 26a for forming a portion of the metal base plate 10 on the opposite side to the ceramic substrate 12 (a portion other than the portion of the metal base plate 10 formed in the metal base plate forming portion 24a). The metal base plate 10 is designed to be formed in a space defined by the metal base plate forming portion 26a and the metal base plate forming portion 24a of the intermediate mold member 24.

The upper mold member 26 has a sprue (inlet) (not shown) for injecting a molten metal into the metal base plate forming portions 24a and 26a from a molten metal injecting nozzle (not shown), and the intermediate mold member 24 and the lower mold member 22 have a molten metal passage (not shown) which extends between the metal base plate forming portions 24a and 26a and the first and second metal plate forming portions 24c and 22b for establishing a communication between the metal base plate forming portions 24a and 26a and the first and second metal plate forming portions 24c and 22b even if the ceramic substrate 12 is housed in the ceramic substrate housing portion 24b while the graphite sheet 16 is housed in the graphite sheet housing portions 22a and 24d.

Figure 4A:
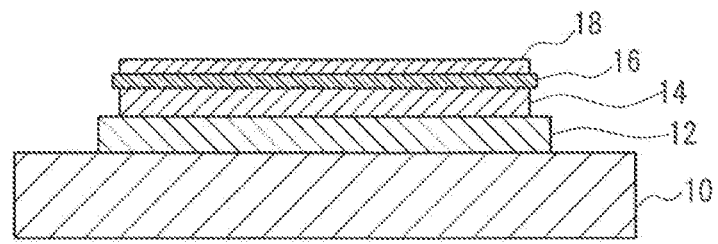
FIG. 4A is a sectional view showing a step of producing the metal/ceramic bonding substrate of FIG. 1 from a bonded product produced by the mold of FIG. 2.
Figure 4B:
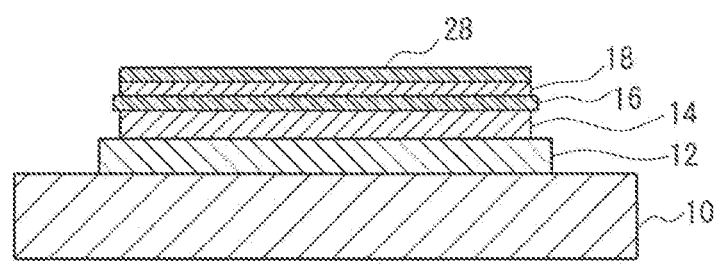
FIG. 4B is a sectional view showing a step of producing the metal/ceramic bonding substrate of FIG. 1 from a bonded product produced by the mold of FIG. 2.
Figure 4C:
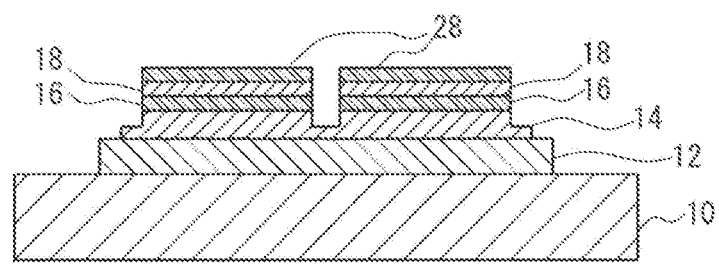
FIG. 4C is a sectional view showing a step of producing the metal/ceramic bonding substrate of FIG. 1 from a bonded product produced by the mold of FIG. 2.
Figure 4D:
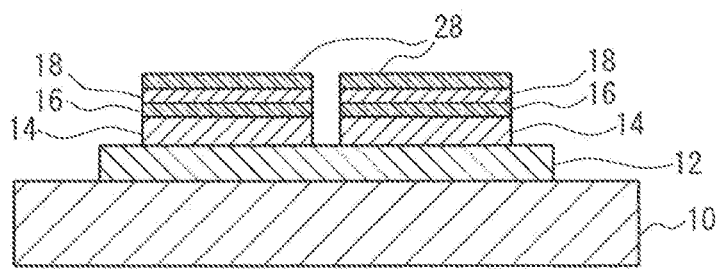
FIG. 4D is a sectional view showing a step of producing the metal/ceramic bonding substrate of FIG. 1 from a bonded product produced by the mold of FIG. 2.

In order to produce the metal/ceramic bonding substrate in the preferred embodiment shown in FIG. 1 by means of such a mold 20, after the graphite sheet 16 is first arranged in the graphite sheet housing portion 22a of the lower mold member 22, the intermediate mold member 24 is put on the lower mold member 22, and then, the ceramic substrate 12 is arranged in the ceramic substrate housing portion 24b. Thereafter, the upper mold member 26 is put on the intermediate mold member 24. In this state, a molten metal of aluminum or an aluminum alloy is injected into the mold 20 to be cooled to produce a metal/ceramic bonding substrate (shown in FIG. 4A) wherein one side of the ceramic substrate 12 is bonded directly to the metal base plate 10, the other side of the ceramic substrate being bonded directly to one side of the first metal plate 14 for circuit pattern, the other side of the first metal plate 14 being bonded directly to one side of the graphite sheet 16, the other side of the graphite sheet 16 being bonded directly to the second metal plate 18 for circuit pattern. Thereafter, aluminum or the aluminum alloy in a portion corresponding to the molten metal passage (sprue runner) is removed. Then, the surface of the second metal plate 18 is buff-polished, and an etching resist 28 is formed on the substantially entire of the surface thereof as shown in FIG. 4B. Thereafter, (portions other than portions corresponding to the shape of a circuit pattern of) the etching resist 28, second metal plate 18, graphite sheet 16 and first metal plate 14 are removed by milling in the thickness directions thereof from the surface of the etching resist 28, to cause the etching resist 28, the second metal plate 18, the graphite sheet 16 and the first metal plate 14 to have the shape of the circuit pattern as shown in FIG. 4C, except that a portion (a thin portion having a thickness of about 0.2 mm) of the first metal plate 14 on the side of the ceramic substrate 12 is caused to remain (in order to prevent the ceramic substrate 12 from being broken by the contact of a cutting tool with the ceramic substrate 12 during milling). Thereafter, a portion of the first metal plate 14 other than the portion corresponding to the shape of the circuit pattern on the surface of the ceramic substrate 12 is etched with an etching solution, such as an aqueous iron chloride solution, to be removed as shown in FIG. 4D, and then, the etching resist 28 is removed. Thus, it is possible to produce a metal/ceramic bonding substrate which has the circuit pattern (of the first metal plate 14, graphite sheet 16 and second metal plate 18) as shown in FIG. 1.

On the second metal plate 18 of the metal/ceramic bonding substrate thus produced, a portion required for soldering thereon a semiconductor device or the like may be plated with nickel or the like.

The molten metal is preferably injected into the mold 20 from the sprue as follows. First, the mold 20 is moved into a bonding furnace (not shown), and the interior of the bonding furnace is caused to be in an atmosphere of nitrogen to decrease the oxygen concentration therein to 100 ppm or less, preferably 10 ppm or less. Then, the mold 20 is heated to a molten metal injecting temperature by the temperature control of a heater. Thereafter, the molten metal, which is heated to the molten metal injecting temperature and which is previously measured, is pressurized at a predetermined pressure by nitrogen gas to be injected into the mold 20 from the sprue. If the molten metal is thus injected, it is possible to prevent large bonding defects from being produced between the metal and the ceramic. After the molten metal is injected into the mold 20, the molten metal is preferably cooled and solidified in the mold 20 while the molten metal therein is pressurized at a predetermined pressure by blowing nitrogen gas into the sprue from a nozzle (not shown). Furthermore, the predetermined pressure applied by nitrogen gas during the injection and cooling of the molten metal is preferably in the range of from 1 kPa to 100 kPa, more preferably in the range of from 3 kPa to 80 kPa, and most preferably in the range of from 5 kPa to 15 kPa. If the pressure is too low, it is difficult to allow the molten metal to be injected into the mold 20. If the pressure is too high, there is some possibility that the positions of the graphite sheet 16 may be shifted and/or the mold 20 may be broken. In particular, when a high pressure of not less than 1 MPa is applied if the mold 20 of carbon is used, there is some possibility that the mold 20 may be broken and/or the molten metal may leak from the mold 20.

Figure 3:
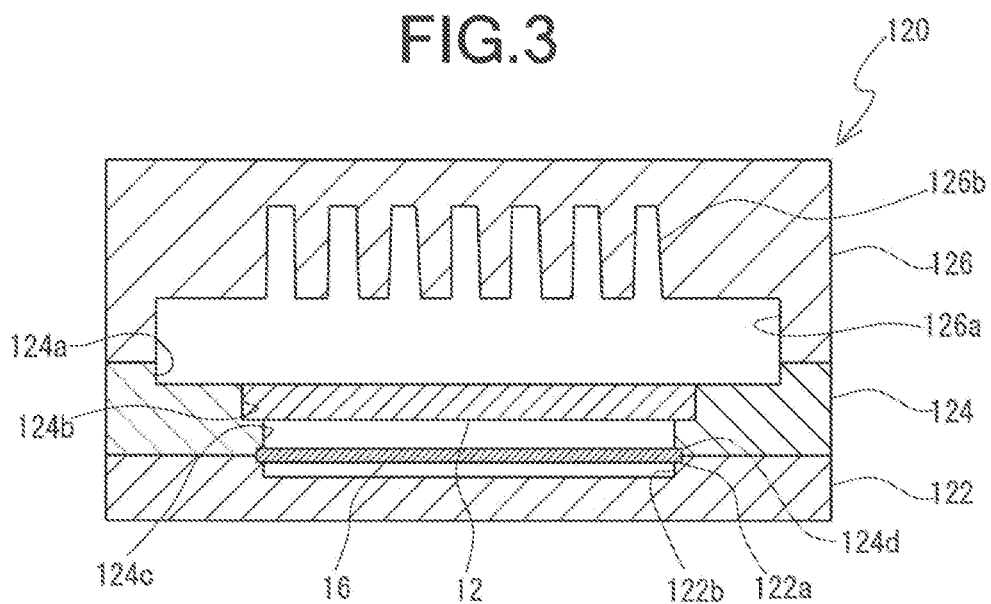
FIG. 3 is a sectional view of a mold used for producing a modified example of the metal/ceramic bonding substrate of FIG. 1.

FIG. 3 shows a mold 120 used for producing a modified example of the preferred embodiment of a metal/ceramic bonding substrate according to the present invention. In this mold 120, the bottom surface of a recessed portion (a metal base plate forming portion) 126a, which is formed on the lower surface (back surface) of an upper mold member 126, has a recessed portion (a radiating fin forming portion) 126b for forming radiating fins, so that it is possible to integrally form the radiating fins on the bottom surface of a metal base plate. Since other constructions are substantially the same constructions as those of the mold 20 of FIG. 2, 100 is added to each of the reference numbers of portions substantially having the same constructions in FIG. 3, and the description thereof is omitted.

Furthermore, the ceramic substrate may be an oxide ceramic substrate of alumina or the like, and may be a non-oxide ceramic substrate of aluminum nitride, silicon nitride or the like.

EXAMPLES

Examples of a metal/ceramic bonding substrate and a method for producing the same according to the present invention will be described below in detail.

Example 1

After a ceramic substrate (SH-30 produced by TD Power Materials Co., Ltd.) of aluminum nitride (AlN) having a size of 50 mm×50 mm×0.6 mm, and a graphite sheet (PGS produced by Panasonic Corporation) having a size of 48 mm×48 mm×0.05 mm (the graphite sheet having a thermal conductivity of 1000 W/m·K in horizontal directions, a thermal conductivity of 20 W/m·K in thickness directions and a linear expansion coefficient of 5 ppm/K) were arranged in a mold of carbon having the same shape as that of the mold 20 shown in FIG. 2, the mold was put in a furnace in an atmosphere of nitrogen. Then, after a molten metal of aluminum having a purity of 99.9% by weight (3N) (aluminum having a thermal conductivity of 220 to 230 W/m·K and a 0.2% proof stress of 18 to 22 MPa) was injected into the mold from the sprue thereof, the molten metal was cooled to be solidified to obtain a metal/ceramic bonding substrate wherein an aluminum base plate having a size of 70 mm×70 mm×5 mm was bonded directly to one side of the ceramic substrate, the other side of the ceramic substrate being bonded directly to one side of a first aluminum plate for circuit pattern having a size of 46 mm 46 mm×0.35 mm, and wherein one side of the graphite sheet was bonded directly to the other side of the first aluminum plate, the other side of the graphite sheet being bonded directly to a second aluminum plate for circuit pattern having a size of 46 mm×46 mm×0.2 mm (the total thickness of the first aluminum plate, the graphite sheet and the second aluminum plate being 0.6 mm). Thereafter, a portion of aluminum corresponding to the molten metal passage (sprue runner) was removed, and the surface of the second aluminum plate was buff-polished. Then, an etching resist was formed on the buff-polished surface of the second aluminum plate. Thereafter, (portions other than portions corresponding to the shape of a circuit pattern of) the etching resist, second aluminum plate, graphite sheet and first aluminum plate were removed by milling in thickness directions thereof from the surface of the etching resist by means of a φ2 mm end mill to cause them to have the shape of the circuit pattern, except that a portion of the first aluminum plate having a thickness of 0.2 mm from the side of the ceramic substrate was caused to remain. Thereafter, the portion of the first aluminum plate other than the portion corresponding to the shape of the circuit pattern on the surface of the ceramic substrate was etched with an aqueous iron chloride solution to be removed, and then, the etching resist was removed to obtain a metal/ceramic bonding substrate having the circuit pattern (of the first aluminum plate, graphite sheet and second aluminum plate) having a size of 45 mm×45 mm×0.6 mm.

There were thus prepared ten metal/ceramic bonding substrates, each of which is the same as the above-described metal/ceramic bonding substrate. The (initial) surface roughness Ra of the surface of the second aluminum plate of each of the metal/ceramic bonding substrates was measured by means of a laser microscope (Super-Depth Surface Profile Measuring Microscope VK-8500 produced by Keyence Corporation). As a result, the (initial) surface roughness Ra thereof was 1.2 μm on average. The (initial) difference in level caused on the grain boundaries of aluminum was measured by the laser microscope. As a result, the difference in level on the grain boundaries was not larger than 10 μm at most. After a heat cycle, in which the metal/ceramic bonding substrate was sequentially held at a temperature of −40° C. for 30 minutes, at a temperature of 25° C. for 10 minutes, at a temperature of 150° C. for 30 minutes and at a temperature of 25° C. for 10 minutes, was repeatedly applied on the metal/ceramic bonding substrate one thousand times, the surface roughness Ra of the surface of the second aluminum plate was measured by the same method as the above-described method. As a result, the surface roughness Ra thereof was 1.5 μm on average. In addition, the difference in level caused on the grain boundaries of aluminum was measured by the same method as the above-described method. As a result, the difference in level on the grain boundaries was not larger than 30 μm at most.

Example 2

With respect to metal/ceramic bonding substrates prepared by the same method as that in Example 1, except that the thickness of the ceramic substrate was 0.3 mm, the surface roughness Ra of the surface of the second aluminum plate, and the difference in level caused on the grain boundaries of aluminum were measured by the same methods as those in Example 1. As a result, the initial surface roughness Ra was 1.2 μm on average, and the initial difference in level on the grain boundaries was not larger than 10 μm at most. The surface roughness Ra after the heat cycles was 1.5 μm on average, and the difference in level on the grain boundaries after the heat cycles was not larger than 30 μm at most.

Example 3

With respect to metal/ceramic bonding substrates prepared by the same method as that in Example 1, except that a ceramic substrate of silicon nitride having a thickness of 0.3 mm was used as the ceramic substrate, the surface roughness Ra of the surface of the second aluminum plate, and the difference in level caused on the grain boundaries of aluminum were measured by the same methods as those in Example 1. As a result, the initial surface roughness Ra was 1.3 μm on average, and the initial difference in level on the grain boundaries was not larger than 10 μm at most. The surface roughness Ra after the heat cycles was 1.5 μm on average, and the difference in level on the grain boundaries after the heat cycles was not larger than 30 μm at most.

Example 4

With respect to metal/ceramic bonding substrates prepared by the same method as that in Example 1, except that the thickness of the graphite sheet was 0.1 mm, that the thickness of the first aluminum plate was 0.9 mm and that the thickness of the second aluminum plate was 0.2 mm, the surface roughness Ra of the surface of the second aluminum plate, and the difference in level caused on the grain boundaries of aluminum were measured by the same methods as those in Example 1. As a result, the initial surface roughness Ra was 1.2 μm on average, and the initial difference in level on the grain boundaries was not larger than 10 μm at most. The surface roughness Ra after the heat cycles was 1.4 μm on average, and the difference in level on the grain boundaries after the heat cycles was not larger than 20 μm at most.

Example 5

With respect to metal/ceramic bonding substrates prepared by the same method as that in Example 2, except that the thickness of the graphite sheet was 0.1 mm, that the thickness of the first aluminum plate was 0.9 mm and that the thickness of the second aluminum plate was 0.2 mm, the surface roughness Ra of the surface of the second aluminum plate, and the difference in level caused on the grain boundaries of aluminum were measured by the same methods as those in Example 2. As a result, the initial surface roughness Ra was 1.2 μm on average, and the initial difference in level on the grain boundaries was not larger than 10 μm at most. The surface roughness Ra after the heat cycles was 1.4 μm on average, and the difference in level on the grain boundaries after the heat cycles was not larger than 20 μm at most.

Example 6

With respect to metal/ceramic bonding substrates prepared by the same method as that in Example 3, except that the thickness of the graphite sheet was 0.1 mm, that the thickness of the first aluminum plate was 0.9 mm and that the thickness of the second aluminum plate was 0.2 mm, the surface roughness Ra of the surface of the second aluminum plate, and the difference in level caused on the grain boundaries of aluminum were measured by the same methods as those in Example 3. As a result, the initial surface roughness Ra was 1.3 μm on average, and the initial difference in level on the grain boundaries was not larger than 10 μm at most. The surface roughness Ra after the heat cycles was 1.4 μm on average, and the difference in level on the grain boundaries after the heat cycles was not larger than 20 μm at most.

Comparative Example 1

With respect to metal/ceramic bonding substrates prepared by the same method as that in Example 1, except that the graphite sheet was not used and that the thickness of the aluminum plate was 0.6 mm, the surface roughness Ra of the surface of the aluminum plate, and the difference in level caused on the grain boundaries of aluminum were measured by the same methods as those in Example 1. As a result, the initial surface roughness Ra was 1.2 μm on average, and the initial difference in level on the grain boundaries was not larger than 10 μm at most. The surface roughness Ra after the heat cycles was 1.9 μm on average, and the difference in level on the grain boundaries after the heat cycles was about 50 μm at most.

Comparative Example 2

With respect to metal/ceramic bonding substrates prepared by the same method as that in Example 3, except that the graphite sheet was not used and that the thickness of the aluminum plate was 0.6 mm, the surface roughness Ra of the surface of the aluminum plate, and the difference in level caused on the grain boundaries of aluminum were measured by the same methods as those in Example 3. As a result, the initial surface roughness Ra was 1.3 μm on average, and the initial difference in level on the grain boundaries was not larger than 10 μm at most. The surface roughness Ra after the heat cycles was 2.1 μm on average, and the difference in level on the grain boundaries after the heat cycles was about 50 μm at most.

Comparative Example 3

With respect to metal/ceramic bonding substrates prepared by the same method as that in Example 1, except that the graphite sheet was not used and that the thickness of the aluminum plate was 1.2 mm, the surface roughness Ra of the surface of the aluminum plate, and the difference in level caused on the grain boundaries of aluminum were measured by the same methods as those in Example 1. As a result, the initial surface roughness Ra was 1.2 μm on average, and the initial difference in level on the grain boundaries was not larger than 10 μm at most. The surface roughness Ra after the heat cycles was 2.3 μm on average, and the difference in level on the grain boundaries after the heat cycles was about 80 μm at most.

Comparative Example 4

With respect to metal/ceramic bonding substrates prepared by the same method as that in Example 3, except that the graphite sheet was not used and that the thickness of the aluminum plate was 1.2 mm, the surface roughness Ra of the surface of the aluminum plate, and the difference in level caused on the grain boundaries of aluminum were measured by the same methods as those in Example 3. As a result, the initial surface roughness Ra was 1.3 µm on average, and the initial difference in level on the grain boundaries was not larger than 10 µm at most. The surface roughness Ra after the heat cycles was 2.5 µm on average, and the difference in level on the grain boundaries after the heat cycles was about 80 µm at most.

Example 7

With respect to metal/ceramic bonding substrates prepared by the same method as that in Example 4, except that a molten metal of an aluminum alloy containing 0.4% by weight of silicon and 0.05% by weight of boron (an aluminum alloy having a thermal conductivity of 180 to 200 W/m·K and a 0.2% proof stress of 20 to 23 MPa) was used in place of the molten metal of aluminum, the surface roughness Ra of the surface of the second aluminum plate, and the difference in level caused on the grain boundaries of aluminum were measured by the same methods as those in Example 4. As a result, the initial surface roughness Ra was 1.3 µm on average, and the initial difference in level on the grain boundaries was not larger than 10 µm at most. The surface roughness Ra after the heat cycles was 1.4 µm on average, and the difference in level on the grain boundaries after the heat cycles was not larger than 20 µm at most.

Example 8

With respect to metal/ceramic bonding substrates prepared by the same method as that in Example 6, except that a molten metal of an aluminum alloy containing 0.4% by weight of silicon and 0.05% by weight of boron (an aluminum alloy having a thermal conductivity of 180 to 200 W/m·K and a 0.2% proof stress of 20 to 23 MPa) was used in place of the molten metal of aluminum, the surface roughness Ra of the surface of the second aluminum plate, and the difference in level caused on the grain boundaries of aluminum were measured by the same methods as those in Example 6. As a result, the initial surface roughness Ra was 1.4 µm on average, and the initial difference in level on the grain boundaries was not larger than 10 µm at most. The surface roughness Ra after the heat cycles was 1.5 µm on average, and the difference in level on the grain boundaries after the heat cycles was not larger than 20 µm at most.

Example 9

With respect to metal/ceramic bonding substrates prepared by the same method as that in Example 4, except that a molten metal of an aluminum alloy containing 0.05% by weight of magnesium and 0.04% by weight of silicon (an aluminum alloy having a thermal conductivity of 190 to 210 W/m·K and a 0.2% proof stress of 20 to 23 MPa) was used in place of the molten metal of aluminum, the surface roughness Ra of the surface of the second aluminum plate, and the difference in level caused on the grain boundaries of aluminum were measured by the same methods as those in Example 4. As a result, the initial surface roughness Ra was 1.2 µm on average, and the initial difference in level on the grain boundaries was not larger than 10 µm at most. The surface roughness Ra after the heat cycles was 1.4 µm on average, and the difference in level on the grain boundaries after the heat cycles was not larger than 20 µm at most.

Example 10

With respect to metal/ceramic bonding substrates prepared by the same method as that in Example 6, except that a molten metal of an aluminum alloy containing 0.05% by weight of magnesium and 0.04% by weight of silicon (an aluminum alloy having a thermal conductivity of 190 to 210 W/m·K and a 0.2% proof stress of 20 to 23 MPa) was used in place of the molten metal of aluminum, the surface roughness Ra of the surface of the second aluminum plate, and the difference in level caused on the grain boundaries of aluminum were measured by the same methods as those in Example 6. As a result, the initial surface roughness Ra was 1.3 µm on average, and the initial difference in level on the grain boundaries was not larger than 10 µm at most. The surface roughness Ra after the heat cycles was 1.4 µm on average, and the difference in level on the grain boundaries after the heat cycles was not larger than 20 µm at most.

Example 11

With respect to metal/ceramic bonding substrates prepared by the same method as that in Example 4, except that a molten metal of an aluminum alloy containing 0.08% by weight of magnesium and 0.06% by weight of silicon (an aluminum alloy having a thermal conductivity of 180 to 200 W/m·K and a 0.2% proof stress of 25 to 30 MPa) was used in place of the molten metal of aluminum, the surface roughness Ra of the surface of the second aluminum plate, and the difference in level caused on the grain boundaries of aluminum were measured by the same methods as those in Example 4. As a result, the initial surface roughness Ra was 1.2 µm on average, and the initial difference in level on the grain boundaries was not larger than 10 µm at most. The surface roughness Ra after the heat cycles was 1.4 µm on average, and the difference in level on the grain boundaries after the heat cycles was not larger than 10 µm at most.

Example 12

With respect to metal/ceramic bonding substrates prepared by the same method as that in Example 6, except that a molten metal of an aluminum alloy containing 0.08% by weight of magnesium and 0.06% by weight of silicon (an aluminum alloy having a thermal conductivity of 180 to 200 W/m·K and a 0.2% proof stress of 25 to 30 MPa) was used in place of the molten metal of aluminum, the surface roughness Ra of the surface of the second aluminum plate, and the difference in level caused on the grain boundaries of aluminum were measured by the same methods as those in Example 6. As a result, the initial surface roughness Ra was 1.3 µm on average, and the initial difference in level on the grain boundaries was not larger than 10 µm at most. The surface roughness Ra after the heat cycles was 1.4 µm on average, and the difference in level on the grain boundaries after the heat cycles was not larger than 10 µm at most.

Example 13

With respect to metal/ceramic bonding substrates prepared by the same method as that in Example 4, except that a molten metal of an aluminum alloy containing 0.1% by weight of zirconium (an aluminum alloy having a thermal conductivity of 180 to 200 W/m·K and a 0.2% proof stress of 25 to 30 MPa) was used in place of the molten metal of aluminum, the surface roughness Ra of the surface of the second aluminum plate, and the difference in level caused on the grain boundaries of aluminum were measured by the same methods as those in Example 4. As a result, the initial surface roughness Ra was 1.2 µm on average, and the initial difference in level on the grain boundaries was not larger than 10 µm at most. The surface roughness Ra after the heat cycles was 1.5 µm on average, and the difference in level on the grain boundaries after the heat cycles was not larger than 10 µm at most.

Example 14

With respect to metal/ceramic bonding substrates prepared by the same method as that in Example 6, except that a molten metal of an aluminum alloy containing 0.1% by weight of zirconium (an aluminum alloy having a thermal conductivity of 180 to 200 W/m·K and a 0.2% proof stress of 25 to 30 MPa) was used in place of the molten metal of aluminum, the surface roughness Ra of the surface of the second aluminum plate, and the difference in level caused on the grain boundaries of aluminum were measured by the same methods as those in Example 6. As a result, the initial surface roughness Ra was 1.3 µm on average, and the initial difference in level on the grain boundaries was not larger than 10 µm at most. The surface roughness Ra after the heat cycles was 1.5 µm on average, and the difference in level on the grain boundaries after the heat cycles was not larger than 10 µm at most.

Example 15

With respect to metal/ceramic bonding substrates prepared by the same method as that in Example 4, except that a molten metal of an aluminum alloy containing 0.2% by weight of zirconium (an aluminum alloy having a thermal conductivity of 170 to 190 W/m·K and a 0.2% proof stress of 27 to 32 MPa) was used in place of the molten metal of aluminum, the surface roughness Ra of the surface of the second aluminum plate, and the difference in level caused on the grain boundaries of aluminum were measured by the same methods as those in Example 4. As a result, the initial surface roughness Ra was 1.2 µm on average, and the initial difference in level on the grain boundaries was not larger than 10 µm at most. The surface roughness Ra after the heat cycles was 1.4 µm on average, and the difference in level on the grain boundaries after the heat cycles was not larger than 10 µm at most.

Example 16

With respect to metal/ceramic bonding substrates prepared by the same method as that in Example 6, except that a molten metal of an aluminum alloy containing 0.2% by weight of zirconium (an aluminum alloy having a thermal conductivity of 170 to 190 W/m·K and a 0.2% proof stress of 27 to 32 MPa) was used in place of the molten metal of aluminum, the surface roughness Ra of the surface of the second aluminum plate, and the difference in level caused on the grain boundaries of aluminum were measured by the same methods as those in Example 6. As a result, the initial surface roughness Ra was 1.3 µm on average, and the initial difference in level on the grain boundaries was not larger than 10 µm at most. The surface roughness Ra after the heat cycles was 1.4 µm on average, and the difference in level on the grain boundaries after the heat cycles was not larger than 10 µm at most.

Example 17

With respect to metal/ceramic bonding substrates prepared by the same method as that in Example 4, except that a molten metal of an aluminum alloy containing 0.1% by weight of zinc (an aluminum alloy having a thermal conductivity of 180 to 200 W/m·K and a 0.2% proof stress of 25 to 30 MPa) was used in place of the molten metal of aluminum, the surface roughness Ra of the surface of the second aluminum plate, and the difference in level caused on the grain boundaries of aluminum were measured by the same methods as those in Example 4. As a result, the initial surface roughness Ra was 1.3 µm on average, and the initial difference in level on the grain boundaries was not larger than 10 µm at most. The surface roughness Ra after the heat cycles was 1.5 µm on average, and the difference in level on the grain boundaries after the heat cycles was not larger than 10 µm at most.

Example 18

With respect to metal/ceramic bonding substrates prepared by the same method as that in Example 6, except that a molten metal of an aluminum alloy containing 0.1% by weight of zinc (an aluminum alloy having a thermal conductivity of 180 to 200 W/m·K and a 0.2% proof stress of 25 to 30 MPa) was used in place of the molten metal of aluminum, the surface roughness Ra of the surface of the second aluminum plate, and the difference in level caused on the grain boundaries of aluminum were measured by the same methods as those in Example 6. As a result, the initial surface roughness Ra was 1.3 µm on average, and the initial difference in level on the grain boundaries was not larger than 10 µm at most. The surface roughness Ra after the heat cycles was 1.5 µm on average, and the difference in level on the grain boundaries after the heat cycles was not larger than 10 µm at most.

Example 19

With respect to metal/ceramic bonding substrates prepared by the same method as that in Example 4, except that a molten metal of an aluminum alloy containing 0.2% by weight of zinc (an aluminum alloy having a thermal conductivity of 170 to 190 W/m·K and a 0.2% proof stress of 27 to 32 MPa) was used in place of the molten metal of aluminum, the surface roughness Ra of the surface of the second aluminum plate, and the difference in level caused on the grain boundaries of aluminum were measured by the same methods as those in Example 4. As a result, the initial surface roughness Ra was 1.3 µm on average, and the initial difference in level on the grain boundaries was not larger than 10 µm at most. The surface roughness Ra after the heat cycles was 1.4 µm on average, and the difference in level on the grain boundaries after the heat cycles was not larger than 10 µm at most.

Example 20

With respect to metal/ceramic bonding substrates prepared by the same method as that in Example 6, except that a molten metal of an aluminum alloy containing 0.2% by weight of zinc (an aluminum alloy having a thermal conductivity of 170 to 190 W/m·K and a 0.2% proof stress of 27 to 32 MPa) was used in place of the molten metal of aluminum, the surface roughness Ra of the surface of the second aluminum plate, and the difference in level caused on the grain boundaries of aluminum were measured by the same methods as those in Example 6. As a result, the initial surface roughness Ra was 1.3 µm on average, and the initial difference in level on the grain boundaries was not larger than 10 µm at most. The surface roughness Ra after the heat cycles was 1.4 µm on average, and the difference in level on the grain boundaries after the heat cycles was not larger than 10 µm at most.

Comparative Example 5

With respect to metal/ceramic bonding substrates prepared by the same method as that in Example 7, except that the graphite sheet was not used, the surface roughness Ra of the surface of the aluminum plate, and the difference in level caused on the grain boundaries of aluminum were measured by the same methods as those in Example 7. As a result, the initial surface roughness Ra was 1.3 µm on average, and the initial difference in level on the grain boundaries was not larger than 10 µm at most. The surface roughness Ra after the heat cycles was 1.7 µm on average, and the difference in level on the grain boundaries after the heat cycles was about 50 µm at most.

Comparative Example 6

With respect to metal/ceramic bonding substrates prepared by the same method as that in Example 8, except that the graphite sheet was not used, the surface roughness Ra of the surface of the aluminum plate, and the difference in level caused on the grain boundaries of aluminum were measured by the same methods as those in Example 8. As a result, the initial surface roughness Ra was 1.4 µm on average, and the initial difference in level on the grain boundaries was not larger than 10 µm at most. The surface roughness Ra after the heat cycles was 1.8 µm on average, and the difference in level on the grain boundaries after the heat cycles was about 50 µm at most.

Comparative Example 7

With respect to metal/ceramic bonding substrates prepared by the same method as that in Example 11, except that the graphite sheet was not used, the surface roughness Ra of the surface of the aluminum plate, and the difference in level caused on the grain boundaries of aluminum were measured by the same methods as those in Example 11. As a result, the initial surface roughness Ra was 1.2 µm on average, and the initial difference in level on the grain boundaries was not larger than 10 µm at most. The surface roughness Ra after the heat cycles was 1.7 µm on average, and the difference in level on the grain boundaries after the heat cycles was about 50 µm at most.

Comparative Example 8

With respect to metal/ceramic bonding substrates prepared by the same method as that in Example 12, except that the graphite sheet was not used, the surface roughness Ra of the surface of the aluminum plate, and the difference in level caused on the grain boundaries of aluminum were measured by the same methods as those in Example 12. As a result, the initial surface roughness Ra was 1.3 µm on average, and the initial difference in level on the grain boundaries was not larger than 10 µm at most. The surface roughness Ra after the heat cycles was 1.7 µm on average, and the difference in level on the grain boundaries after the heat cycles was about 50 µm at most.

Furthermore, it can be seen that although the difference in level on the grain boundaries after the heat cycles varies relatively widely in accordance with each of the metal/ceramic bonding substrates, the difference in level can be suppressed so as not to be larger than 30 µm at most in examples, whereas the difference in level is a large difference of about 50 to 80 µm at most in comparative examples, so that the mass-production of the metal/ceramic bonding substrates in comparative examples is unsuitable. In examples, even if the heat cycle is repeatedly applied on the metal/ceramic bonding substrate wherein thick aluminum plates (the total of the thicknesses of the first and second aluminum plates is not less than 0.5 mm (preferably not less than 0.8 mm)) are bonded to the ceramic substrate, it is possible to prevent a large difference in level from being caused on portions corresponding to the grain boundaries of aluminum or the aluminum alloy, so that it is possible to provide a metal/ceramic bonding substrate having excellent thermal conductivity and/or excellent electrical conductivity.

DESCRIPTION OF REFERENCE NUMBERS

10 Metal Base Plate
12 Ceramic Substrate
14 First Metal Plate
16 Graphite Sheet
18 Second Metal Plate
20, 120 Mold
22, 122 Lower Mold Member
22a, 122a Graphite Sheet Holding Portion
22b, 122b Second Metal Plate Forming Portion
24, 124 Intermediate Mold Member
24a, 124a Metal Base Plate Forming Portion
24b, 124b Ceramic Substrate Holding Portion
24c, 124c First Metal Plate Forming Portion
24d, 124d Graphite Sheet Holding Portion
26, 126 Upper Mold Member
26a, 126a Metal Base Plate Forming Portion
126b Radiating Fin Forming Portion

The invention claimed is:

1. A metal/ceramic bonding substrate comprising:
a metal base plate of aluminum or an aluminum alloy;
a ceramic substrate, one side of which is bonded directly to the metal base plate;
a first metal plate of aluminum or the aluminum alloy, one side of which is bonded directly to the other side of the ceramic substrate;
a graphite sheet, one side of which is bonded directly to the other side of the first metal plate; and
a second metal plate of aluminum or the aluminum alloy which is bonded directly to the other side of the graphite sheet,
wherein a circuit pattern is formed by the first metal plate, the graphite sheet and the second metal plate.

2. A metal/ceramic bonding substrate as set forth in claim 1, wherein the graphite sheet extends in substantially parallel to a bonding surface of the first metal plate to the ceramic substrate.

3. A metal/ceramic bonding substrate as set forth in claim 2, wherein the graphite sheet extends on a substantially entire surface of a plane which extends in substantially parallel to the bonding surface of the first metal plate to the ceramic substrate.

4. A metal/ceramic bonding substrate as set forth in claim 1, wherein the graphite sheet has an end face which is exposed to the outside.

5. A method for producing a metal/ceramic bonding substrate, the method comprising the steps of:
causing a peripheral portion of a graphite sheet and a peripheral portion of a ceramic substrate to be supported on a mold so that the graphite sheet and the ceramic substrate are arranged in substantially parallel to each other in the mold so as to be apart from each other;

injecting a molten metal of aluminum or an aluminum alloy into the mold so as to allow the molten metal to contact both sides of the graphite sheet and both sides of the ceramic substrate in the mold; and cooling and solidifying the molten metal in the mold to form a metal base plate of aluminum or the aluminum alloy to bond the metal base plate directly to one side of the ceramic substrate, while forming a first metal plate of aluminum or the aluminum alloy to bond the first metal plate directly to one side of the graphite sheet and to the other side of the ceramic substrate, and while forming a second metal plate of aluminum or the aluminum alloy to bond the second metal plate directly to the other side of the graphite sheet.

6. A method for producing a metal/ceramic bonding substrate as set forth in claim 5, which further comprises:

forming a mask on the surface of the second metal plate of the metal/ceramic bonding substrate;

removing a portion other than a portion, which corresponds to a shape of a circuit pattern of the mask, second metal plate, graphite sheet and first metal plate, in thickness directions thereof from the surface of the mask by milling to cause the mask, the second metal plate, the graphite sheet and the first metal plate to have the shape of the circuit pattern, except that a portion of the first metal plate on the side of the ceramic substrate is caused to remain;

etching the portion of the first metal plate other than the portion, which corresponds to the shape of the circuit pattern, on the surface of the ceramic substrate; and removing the mask to produce a metal/ceramic bonding substrate which has the circuit pattern of the first metal plate, graphite sheet and second metal plate.

* * * * *